United States Patent
Arnold et al.

(10) Patent No.: US 9,564,948 B2
(45) Date of Patent: Feb. 7, 2017

(54) 3-LEVEL BRIDGE DRIVER WITH SINGLE SUPPLY AND LOW COMMON MODE EMI EMISSION

(75) Inventors: Siegfried Arnold, St. Ruprecht AD Raab (AT); Robert Kofler, Graz-Kroisbach (AT); Davide Maschera, Lieboch (AT); Bardo Mueller, Seggauberg (AT)

(73) Assignee: NXP B.V., Eindhoven (NL)

(*) Notice: Subject to any disclaimer, the term of this patent is extended or adjusted under 35 U.S.C. 154(b) by 1167 days.

(21) Appl. No.: 13/299,915

(22) Filed: Nov. 18, 2011

(65) Prior Publication Data

US 2013/0129016 A1    May 23, 2013

(51) Int. Cl.
*H04L 25/03* (2006.01)
*H04B 5/00* (2006.01)
*H03K 17/691* (2006.01)

(52) U.S. Cl.
CPC .......... *H04B 5/0031* (2013.01); *H04B 5/0037* (2013.01); *H04B 5/0081* (2013.01); *H03K 17/691* (2013.01)

(58) Field of Classification Search
CPC .... H04B 5/0031; H04B 5/0037; H04B 5/0081
USPC .............. 340/10.1, 10.51; 375/296
See application file for complete search history.

(56) References Cited

U.S. PATENT DOCUMENTS

| | | | |
|---|---|---|---|
| 5,504,485 A * | 4/1996 | Landt et al. | 342/42 |
| 5,982,230 A | 11/1999 | Macbeth | |
| 7,479,884 B1 * | 1/2009 | Fullerton | G01S 13/003 340/572.1 |
| 7,772,904 B1 * | 8/2010 | Cooke | 327/175 |
| 7,928,848 B2 | 4/2011 | Moriyama | |
| 2002/0153902 A1 * | 10/2002 | Thiel et al. | 324/600 |
| 2007/0063041 A1 | 3/2007 | Kamiyama et al. | |
| 2007/0176679 A1 * | 8/2007 | Kluge | 330/253 |
| 2008/0064345 A1 | 3/2008 | Yoshida et al. | |
| 2008/0079492 A1 * | 4/2008 | Kobayashi | H03F 1/26 330/261 |
| 2008/0124162 A1 | 5/2008 | Yamaguchi et al. | |
| 2008/0223931 A1 * | 9/2008 | Spiess et al. | 235/439 |
| 2008/0261555 A1 * | 10/2008 | Chen et al. | 455/404.1 |
| 2009/0224893 A1 | 9/2009 | Kondo et al. | |
| 2009/0247079 A1 | 10/2009 | Charles et al. | |
| 2009/0289716 A1 * | 11/2009 | Jaeger et al. | 330/261 |

(Continued)

FOREIGN PATENT DOCUMENTS

| | | | | |
|---|---|---|---|---|
| EP | 1 538 036 A1 * | 6/2005 | | B60R 25/04 |
| JP | 2000513510 A | 10/2000 | | |

(Continued)

OTHER PUBLICATIONS

Extended European Search Report for European Patent Appln. No. 12181694.6 (Jul. 4, 2014).

(Continued)

*Primary Examiner* — Quan-Zhen Wang
*Assistant Examiner* — Stephen Burgdorf

(57) ABSTRACT

In one embodiment, a circuit, having a single supply, is provided to transmit a wireless signal with low common mode electromagnetic interference (EMI) emission. The circuit can achieve common mode attenuations of 40 dB or greater as a result of the symmetric built circuit. Also included is a system that includes a transmission circuit and a receiver circuit, and a method of using such a system.

15 Claims, 7 Drawing Sheets

(56) References Cited

U.S. PATENT DOCUMENTS

| | | | |
|---|---|---|---|
| 2010/0009627 A1 | 1/2010 | Huomo | |
| 2010/0073063 A1 | 3/2010 | Lakshmikumar et al. | |
| 2010/0225391 A1 | 9/2010 | Kim | |
| 2011/0064245 A1 | 3/2011 | Kim et al. | |
| 2011/0102026 A1 | 5/2011 | Takahashi | |
| 2011/0156640 A1* | 6/2011 | Moshfeghi | 320/108 |
| 2012/0277018 A1* | 11/2012 | Boyd et al. | 473/224 |
| 2012/0278192 A1* | 11/2012 | Shirron | G06Q 20/123 705/26.1 |
| 2013/0223651 A1* | 8/2013 | Hoyerby | H03F 3/2173 381/120 |
| 2014/0152253 A1 | 6/2014 | Ozaki et al. | |

FOREIGN PATENT DOCUMENTS

| | | | | |
|---|---|---|---|---|
| JP | 2001134233 A | | 5/2001 | |
| JP | 2005163453 A | * | 6/2005 | ............ E05B 49/00 |
| JP | 2007124732 A | | 5/2007 | |
| JP | 20080072210 A | | 3/2008 | |
| JP | 2012518337 A | | 8/2012 | |
| KR | 1020080093641 A | | 10/2008 | |
| KR | 1020100099544 A | | 9/2010 | |
| KR | 1020110029776 A | | 3/2011 | |

OTHER PUBLICATIONS

Japanese Patent Application No. 2012-243696, Notice of Grant, May 21, 2014.
Korean Patent Appln. No. 1012-0130572, Notice Of Allowance, Nov. 12, 2014.

* cited by examiner

3-LEVEL BRIDGE DRIVER WITH SINGLE SUPPLY AND LOW COMMON MODE EMI EMISSION

Square wave drivers are used to drive radio-frequency-identification (RFID) antennas because the drivers can be built with high efficiency (having lower power dissipation). Further, the square wave drivers are used because of the associated high q-factor, a low rate of energy loss relative to the energy stored. The high Q-factor of an antenna resonator can filter the distorted harmonics of the square wave away with sufficiently high attenuation.

According to certain embodiments, this disclosure is directed towards a circuit that includes a resonance circuit positioned between two power-receiving terminals and switching circuitry for coupling different levels of square wave voltage signals from power supply terminals. The square wave voltage signals, including upper-level, lower-level, and mid-level voltage signals, effect energy through the resonance circuit, which in turn, causes wireless transmission of the information signal to an external circuit. Additionally, another circuit is designed with the switching circuitry for eliminating direct current paths from each of the power-receiving terminals, and thus directing the power received at the power-receiving terminals to the mid-level voltage signal.

The instant disclosure is also directed towards a system that includes a transmission circuit and a receiver circuit. The transmission circuit is designed for transmitting an information signal, and includes a transmission resonance circuit and switching circuitry. The transmission resonance circuit is located between power-receiving terminals, and is designed to wirelessly transmit the information signal of the transmission circuit. The switching circuitry of the instant transmission circuit couples three different levels of square wave voltage signals from power supply terminals (upper-level, lower-level, and mid-level voltage signals) to effect energy through the transmission resonance circuit, which causes wireless transmission of the information signal. Other circuitry of the transmission circuit is arranged with the switching circuit for eliminating direct current paths from each of the power-receiving terminals. The elimination of the direct current paths permits the power received at the power-receiving terminals to be directed to the mid-level voltage signals. The system also includes a receiver circuit that is designed to receive the information signal through use of a receiver resonator circuit, which is configured and arranged to wirelessly receive the information signal, and an identification circuit, designed to confirm the authenticity of the transmission circuit.

Another aspect of the instant disclosure involves a method of using a system that includes a transmission circuit and a receiver circuit. The method includes transmitting an information signal using the transmission circuit. This transmission, in turn, involves a transmission resonance circuit, switching circuitry and other circuitry. The transmission resonance circuit is located between power-receiving terminals, and wirelessly transmits the information signal. The switching circuitry, used in the instant embodiment, couples three different levels (upper-level, lower-level, and mid-level) of square wave voltage signals from power supply terminals to effect energy through the transmission resonance circuit, and cause wireless transmission of the information signal. The transmission circuit also includes a circuit arranged with the switching circuitry for facilitating elimination of DC current paths from each of the power-receiving terminals, and thereby directing the power received at the power-receiving terminals to the mid-level voltage signal. The method further includes receiving the transmitted information signal by a receiver circuit. The receiver circuit (e.g., having a receiver resonator circuit that wirelessly receives the information signal) and an identification circuit, one used to confirm that authenticity of the transmission circuit.

The above discussion is not intended to describe each embodiment or every implementation.

Various example embodiments may be more completely understood in consideration of the following detailed description in connection with the accompanying drawings, in which.

Figure 1:
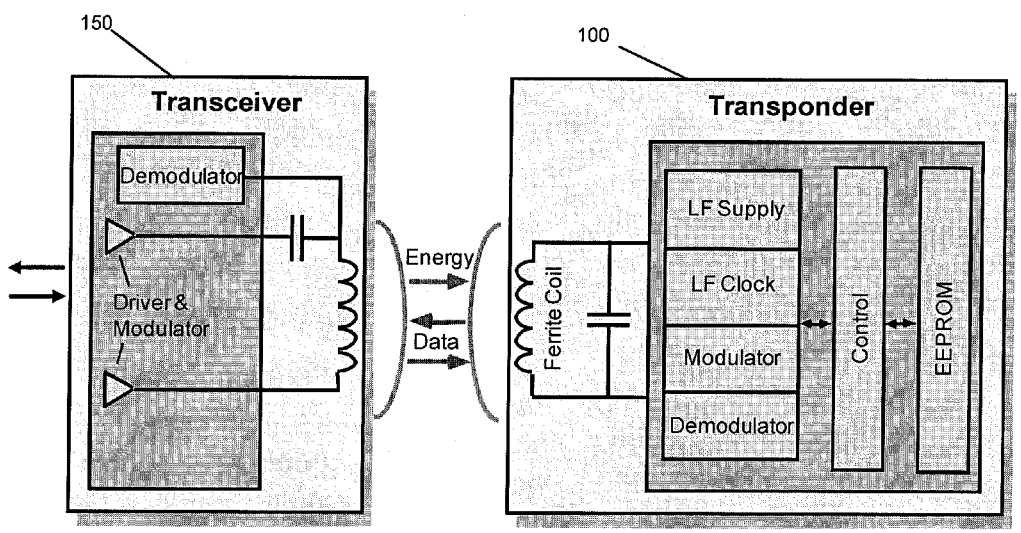
FIG. 1 shows a system diagram of a transceiver and a transponder in accordance with an example embodiment of the instant disclosure.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

Aspects of the present invention are believed to be applicable to a variety of different types of devices, systems and arrangements for bridge driver circuitry with a low common mode electromagnetic interference (EMI) emission including those involving wireless transmission of a signal. While the present invention is not necessarily so limited, various aspects of the invention may be appreciated through a discussion of examples using this context.

In accordance with one or more embodiments, various example embodiments are directed to circuits, systems, and methods that, when operated with maximum amplitude, can achieve a common mode EMI emissions that are theoretically zero. Averaging the power received in the circuit, system, or method, can effectively retain only a direct current component that does not affect EMI emission, and obtain common mode attenuations of 40 dB and greater.

In an example embodiment, a system includes a transmission circuit and a receiver circuit. The transmission circuit is designed for transmitting an information signal. The transmission circuit includes a transmission resonance circuit and switching circuitry. The transmission resonance circuit is located between power-receiving terminals, and is designed to wirelessly transmit the information signal of the transmission circuit. In certain specific embodiments, the transmission resonance circuit has an operating frequency between about 50 KHz, and about 150 KHz. The switching circuitry of the instant transmission circuit, is configured and arranged for coupling of three different levels of square wave voltage signals from power supply terminals (upper-level, lower-level, and mid-level voltage signals) to effect energy through the transmission resonance circuit, which causes wireless transmission of the information signal. In certain embodiments, the transmission circuit achieves common mode attenuations of 40 dB or greater. The transmission circuit also includes another circuit, configured and arranged with the switching circuit, and designed for eliminating DC current paths from each of the power-receiving terminals. The elimination of the DC current paths directs the power received at the power-receiving terminals to the mid-level voltage signals.

In the instant embodiment, the system also includes a receiver circuit that is designed to receive the information signal. The receiver circuit includes a receiver resonator circuit, which is configured and arranged to wirelessly receive the information signal, and an identification circuit, designed to confirm the authenticity of the transmission circuit.

In certain specific embodiments, the above describe system can be incorporated in to an audio amplifier. Further, in another example embodiment, the system can be used in a passive-keyless entry device. In yet another example embodiment, the transmission circuit and the receiver resonance circuit are used in a contactless charging system.

In another example embodiment consistent with the instant disclosure, a circuit is devised to include a resonance circuit. The resonance circuit is located between two power-receiving terminals and is designed for wireless transmitting an information signal to an external circuit. The resonance circuit can also have an operating frequency between about 50 and about 150 KHz.

Switching circuitry can also be included for coupling different levels of square wave voltage signals from power supply terminals. In certain embodiments, the switching circuit will include two power supply terminals. The square wave voltage signals include upper-level, lower-level, and mid-level voltage signals, and effect energy through the resonance circuit, which in turn, causes wireless transmission of the information signal. In certain specific embodiments, the switching circuitry further includes a feedback loop configured to stabilize a mid-level potential of the circuit. The switching circuitry includes at least one switch in certain embodiments. Another circuit is configured and arranged with the switching circuitry, for eliminating DC current paths from each of the power-receiving terminals, and thus directing the power received at the power-receiving terminals to the mid-level voltage signal.

In certain specific embodiments of the circuits described herein can have common mode electromagnetic interference (EMI) emission of the circuit is approximately zero. In other embodiments, the circuits achieve common mode attenuations of 40 dB or greater. In certain specific embodiments, the switching circuitry is designed to pause during switching to create a break-before-make gap. Further, the switching circuitry can additionally be controlled using a proportional-integral-derivative controller (PID controller), and in yet other embodiments, the switching circuitry can be controlled via a mixed-signals controller.

The disclosure is also directed towards a method of using a system that includes at transmission circuit, and a receiver circuit. The method of the embodiment described here is characterized by transmitting an information signal using the transmission circuit. The transmitting of the information signal is accomplished by the elements of the transmission circuit which includes a transmission resonance circuit (which can have an operating frequency between about 50 KHz and about 150 KHz), switching circuitry, and another circuit. The transmission resonance circuit is located between power-receiving terminals and wirelessly transmits the information signal. The switching circuitry, used in the instant embodiment, is configured and arranged for coupling three different levels of square wave voltage signals from power supply terminals, to effect energy through the transmission resonance circuit and cause wireless transmission of the information signal. The three different levels of the square wave voltage signals include upper-level, lower-level, and therebetween mid-level voltage signals. The transmission circuit used in the method also includes another circuit, arranged with the switching circuitry that is designed to eliminate DC current paths from each of the power-receiving terminals thereby directing the power received at the power-receiving terminals to the mid-level voltage signal.

The method of the instant embodiment also is characterized by receiving the information signal by a receiver circuit. The receiver circuit includes a receiver resonator circuit that wirelessly receives the signal, and an identification circuit that confirms that authenticity of the transmission circuit. In certain embodiments, the instant method achieves common mode attenuations of 40 dB or greater.

Turning now to the figures, FIG. 1 shows an example embodiment of a system in accordance with the instant disclosure. FIG. 1 shows the exchange of energy and data between a transmission device 150 and a receiver device 100.

Figure 2:
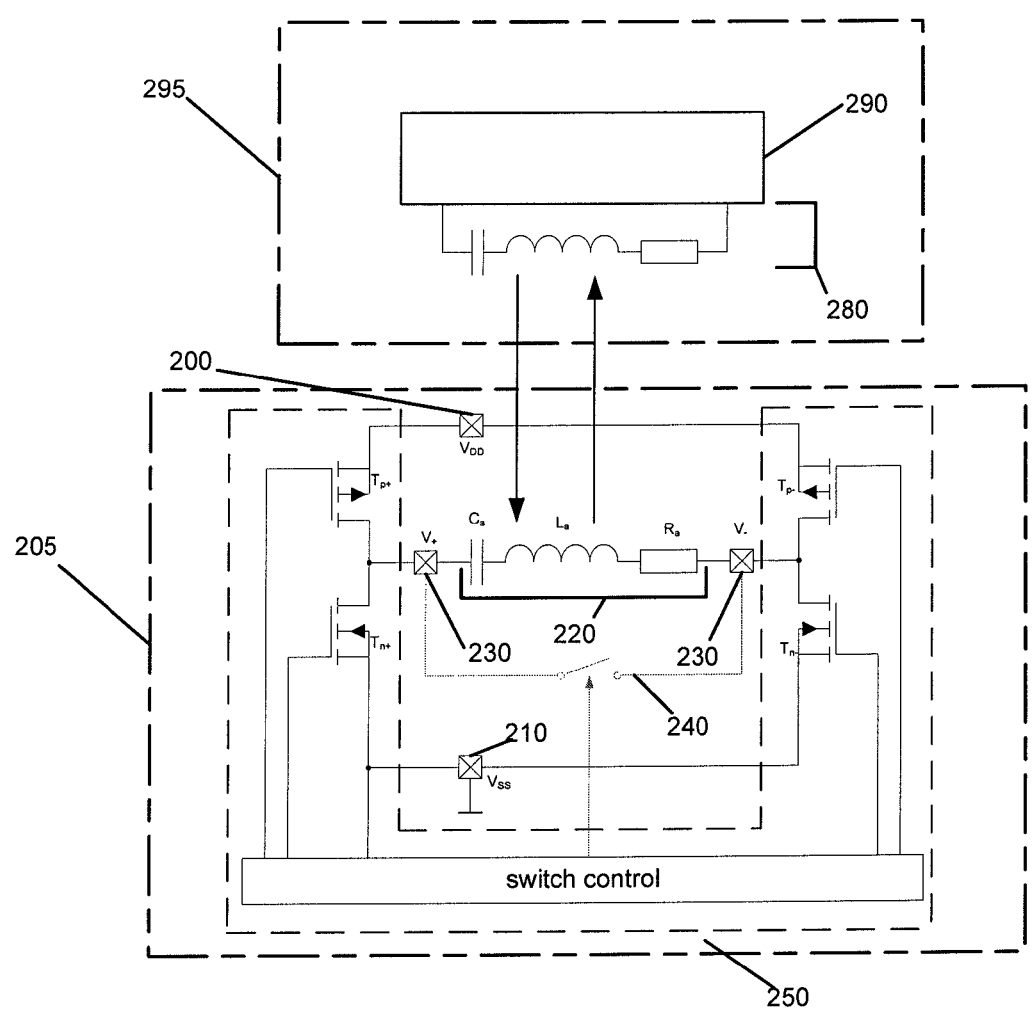
FIG. 2 shows a circuit level system diagram of a transmission and receiver circuit in accordance with an example embodiment of the instant disclosure.

FIG. 2 shows a system in accordance with an example embodiment of the instant disclosure. FIG. 2 shows a transmission circuit 205 and a receiver circuit 295. The transmission circuit 205, of FIG. 2 is designed for transmitting an information signal. The transmission circuit 205 includes a transmission resonance circuit 220 located between power-receiving terminals 230, and is designed to wirelessly transmit the information signal of the transmission circuit 205. In certain specific embodiments, the transmission resonance circuit 220 has an operating frequency between about 50 KHz and about 150 KHz.

The transmission circuit, as part of the system shown in FIG. 2, also includes switching circuitry in various circuit based forms. These forms can vary depending on the preferred implementation or application. For example, the switch control block, shown in FIG. 2, can be implemented as logic circuitry (such as using a programmed microcomputer and/or discrete logic components) and such logic circuitry can be viewed as including implemented switching circuitry as multiple sections with switching circuitry (e.g., a switch 240) and another circuit section (e.g., p-type transistors, n-type transistors, and switch controller).

A first form is depicted as switching circuitry 240 and 250 which is designed for coupling of three different levels of square wave voltage signals from power supply terminals 200/210 (upper-level, lower-level (caused by 250), and mid-level (caused by 240) voltage signals) to effect energy through the transmission resonance circuit 220. In certain embodiments, the transmission circuit achieves common mode attenuations of 40 dB or greater. The energy effected through the transmission resonance circuit 220 causes wireless transmission of the information signal.

Another form of such switching circuitry is shown in the transmission circuit of FIG. 2. As depicted, the switching circuitry includes another circuit (e.g., p-type transistors and n-type transistors, a switch 240, and switch control) configured and arranged for eliminating DC current paths from each of the power-receiving terminals 230. The elimination of the DC current paths directs the power received at the power-receiving terminals 230 to the mid-level voltage signals. The system shown in FIG. 2 also includes a receiver circuit 295 that is designed to receive the information signal. The receiver circuit 295 includes a receiver resonator circuit 280 that wirelessly receives the information signal. Additionally, the receiver circuit 295 incorporates an identification circuit 290 that confirms the authenticity of the transmission circuit 205.

Figure 3:
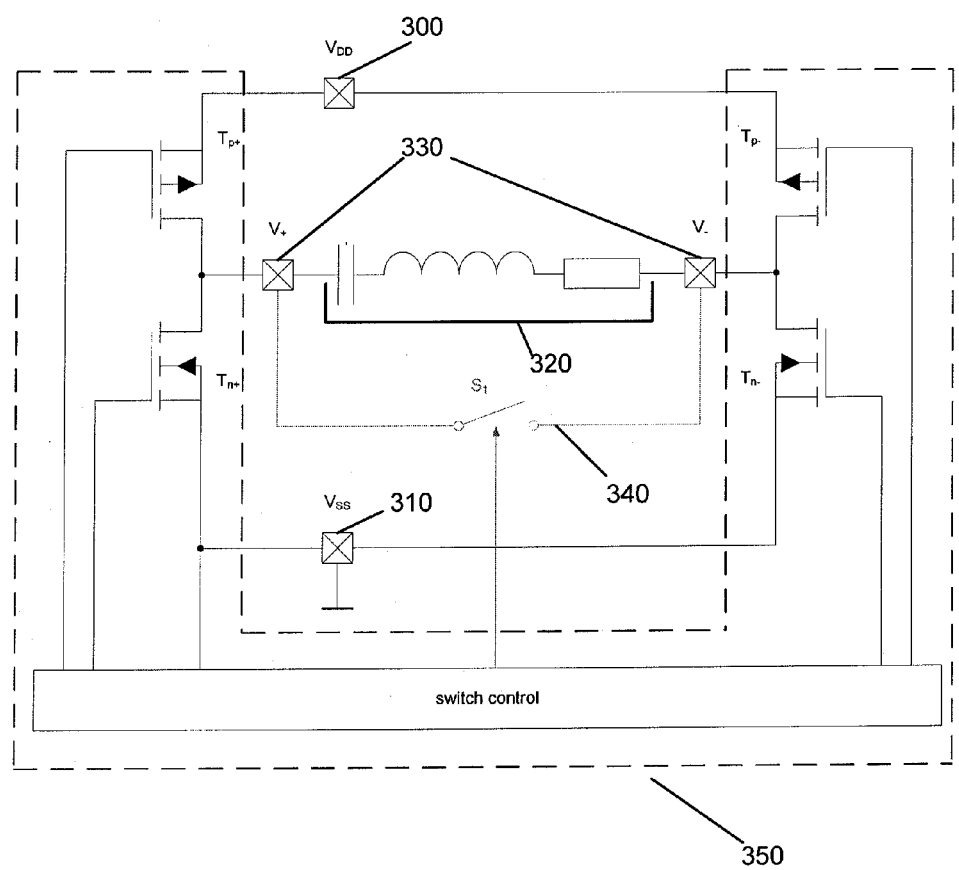
FIG. 3 shows an example embodiment of a circuit in a circuit level diagram in accordance the instant disclosure.

FIG. 3 shows a circuit in accordance with the instant disclosure. The circuit of FIG. 3 maintains common mode electromagnetic interference (EMI) emission at approximately zero, and achieves common mode attenuations of 40 dB or greater. The circuit shown in FIG. 3 includes a resonance circuit 320 that is positioned between two power-receiving terminals 330. The resonance circuit 320 (having an operating frequency between about 50 KHz and about 150 KHz) is designed for wireless transmitting an information signal to an external circuit. The circuit shown in FIG. 3 also includes switching circuit 340 and 350 for coupling different levels of square wave voltage signals (upper-level, lower-level (both caused by 350), and mid-level (caused by 340) voltage signals) from power supply terminals 300/310. The switching circuitry 340 includes at least one switch in certain embodiments. In certain embodiments, the circuit will include two power supply terminals 300/310. The square wave voltage signals effect energy through the resonance circuit 320, which in turn, cause wireless transmission of the information signal. Further included in the illustrated embodiment of FIG. 3 is another circuit 350, designed with the switching circuitry 340, for eliminating DC current paths from each of the power-receiving terminals 330, and thus directing the power received at the power-receiving terminals 330 to the mid-level voltage signal.

In certain instances, the switching circuitry is designed to pause during switching to create a break-before-make gap. Further, the switching circuitry can additionally be controlled using a proportional-integral-derivative controller (PID controller), and in other embodiments, the switching circuitry can be controlled via a mixed-signals controller.

As can be seen in FIG. 3, the zero volts condition across the resonator circuit 320 is sufficient to short the power receiving terminals ($V_+$ and $V_-$) 330 together. Therefore, the power receiving terminals 330 of the circuit are not necessarily tied to $V_{mid}$. When both power receiving terminals 330 are shorted together, the resulting waveform for the resonator circuit 320 is in the form shown in FIG. 6. However, during the time interval where the power receiving terminals 330 are shorted together, the potential of the drive pins would be undefined. More specifically, although there is no direct current path, which would define the potential during the switching interval, the resulting potential will end up close to the midpoint voltage (half of $V_{DD}$). The resulting potential closes on the midpoint voltage because constructing the circuit in symmetrical manner results in parasitic capacitances at the power receiving terminals 330 ($V_+$ and $V_-$) (including the cable capacitances to ground) that are approximately equal. Therefore, again referring to FIG. 3, closing the switching circuitry 340 discharges one parasitic capacitor to $V_{DD}$, and the other parasitic capacitor discharges to $V_{SS}$ (ground). Further, the common potential will approximately assume half of $V_{DD}$ when both capacitors are connected through the switching circuitry 340.

Figure 4:
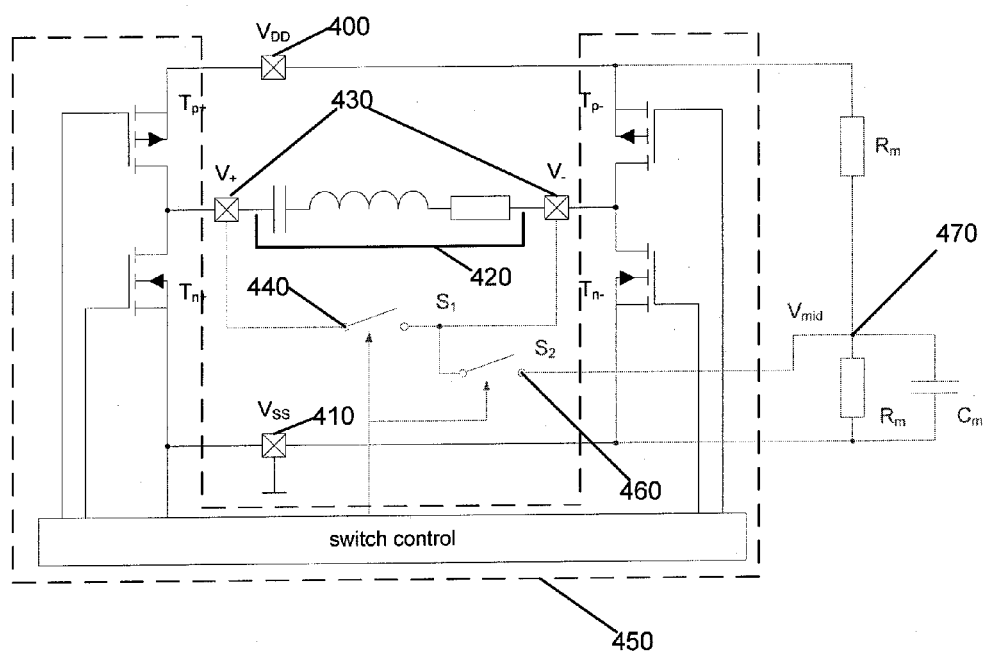
FIG. 4 shows a circuit level diagram of another example embodiment of a circuit in accordance with the instant disclosure.

FIG. 4 shows another example embodiment of a circuit in accordance with the instant disclosure. The circuit shown in FIG. 4, achieving common mode electromagnetic interference (EMI) emission of approximately zero, includes another circuit 450 that is configured and arranged with switching circuitry 440/450/460, for eliminating DC current paths from power receiving terminals 430. The illustrated circuit obtains common mode attenuations of 40 dB or greater. The circuit shown in FIG. 4 has two switches 440/460 that are included in the switching circuitry. The switching circuitry 440/460 shown in FIG. 4 is designed for coupling three different levels of square wave signals from power supply terminals 400/410. The three different levels include upper-level, lower-level (driven by 450), and mid-level (by closing 440 and 460) voltage signals. The second switch 460 of the switching circuitry 440/460 is designed to connect the circuit to a mid-point voltage 470 for stabilization. Additionally, the circuit includes a resonance circuit 420 that is located between the power-receiving terminals 430. The resonance circuit 420 is designed for wireless transmitting an information signal to an external circuit. The resonance circuit shown in FIG. 4 has an operating frequency between about 50 KHz and about 150 KHz. The square wave voltage signal from the power-supply terminals 400/410 effects energy through the resonance circuit 420, and causes wireless transmission of the information signal.

The potential can be further defined by making a second connection to the midpoint potential $V_{mid}$ as shown in FIG. 4. When both switches 440/460, shown in FIG. 4, are closed, the main portion of the resonator circuit 420 current flows through 440 along the path between the power receiving terminals ($V_+$ and $V_-$) 430. A small amount of current flows through 460 (minimally affecting the midpoint potential). Therefore, the switch 460 can have a much larger on-resistance than 440.

Figure 5A:
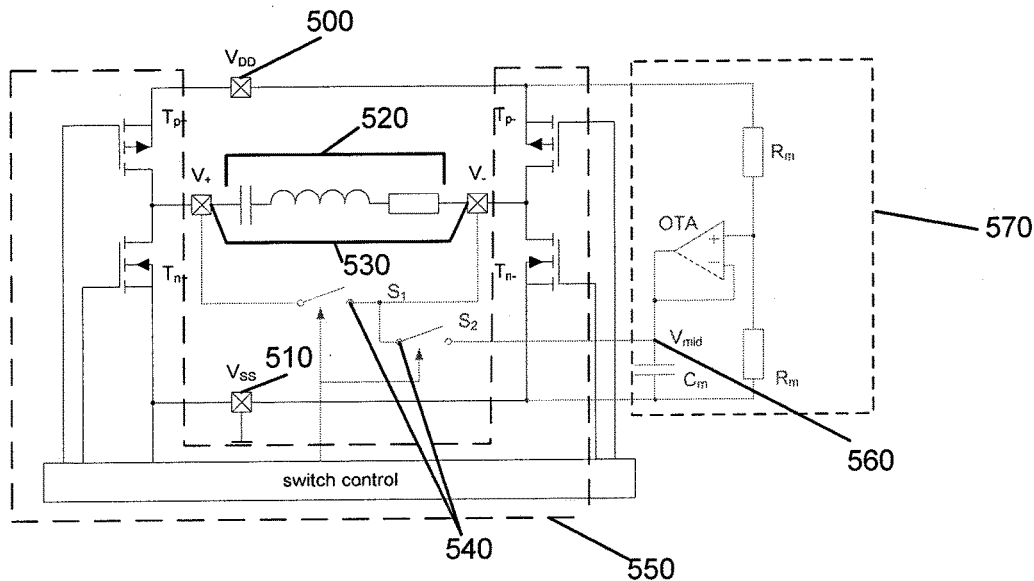
FIG. 5A shows an example circuit, of the instant disclosure, including an example feedback loop in a circuit diagram.
Figure 5B:
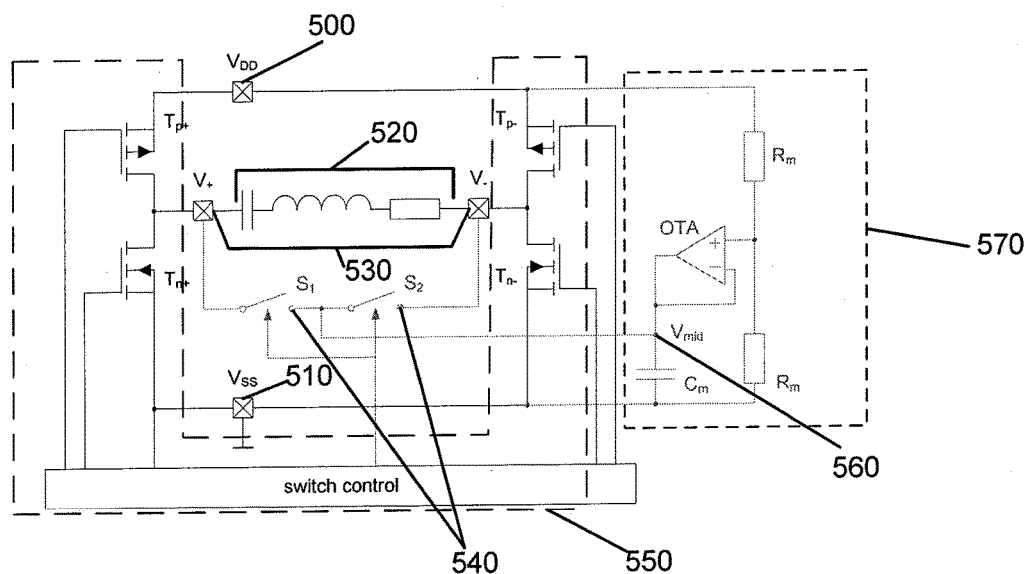
FIG. 5B shows an example circuit, of the instant disclosure, including another example feedback loop in a circuit diagram.

FIGS. 5A and 5B show another circuit in accordance with the instant disclosure. The circuit shown in FIGS. 5A and 5B includes a resonance circuit 520 (operating between about 50 KHz and 150 Khz) located between power-receiving terminals 530. The resonance circuit 520 wirelessly transmits an information signal to an external circuit in response to square wave voltage signals generated from power supply terminals 500/510 by pushing energy through the resonance circuit 520. The circuit shown in FIGS. 5A and 5B includes switching circuitry 540/550 for coupling different levels of the square wave voltage signals (upper-level, lower-level (driven by 550), and mid-level voltage (caused by 540) signals). FIGS. 5A and 5B also show a feedback loop 570 to further stabilize the mid-point potential 560 of the circuit (the offset brought onto the $V_{mid}$ node can become large due to charge injection). The switching circuitry 540 of the circuits shown in FIGS. 5A and 5B includes two switches. As seen in FIG. 5A, the two switches of the switching circuitry 540 can be staggered, or, as shown in FIG. 5B, the two switches of the switching circuitry 540 can be in series (in the event that perfect symmetry is desired). In both circuit diagrams of FIGS. 5A and 5B, the second switch of the switching circuitry 540 couples the circuit to its midpoint potential 560. For the circuits of FIGS. 5A and 5B, common mode electromagnetic interference (EMI) emission of the circuit is approximately zero, and common mode attenuations are realized at levels of 40 dB or greater.

Electromagnetic compatibility (EMC) regulations require that the output amplitude of an RFID transmitter can be controlled in amplitude. One method of controlling the amplitude is to provide a programmable supply voltage of the driver. A programmable supply voltage is expensive, and typically has achieves a relatively small $V_{DD,max}/V_{DD,min}$ ratio of between 5 and 10 (a common mode attention between 14 dB and 20 dB). Another method of controlling the amplitude of the RFID transmitter is to vary the width and/or phase shift of the driver output pulses. This modulation results in shorter time intervals where an antenna resonator is actively driven.

Figure 6:
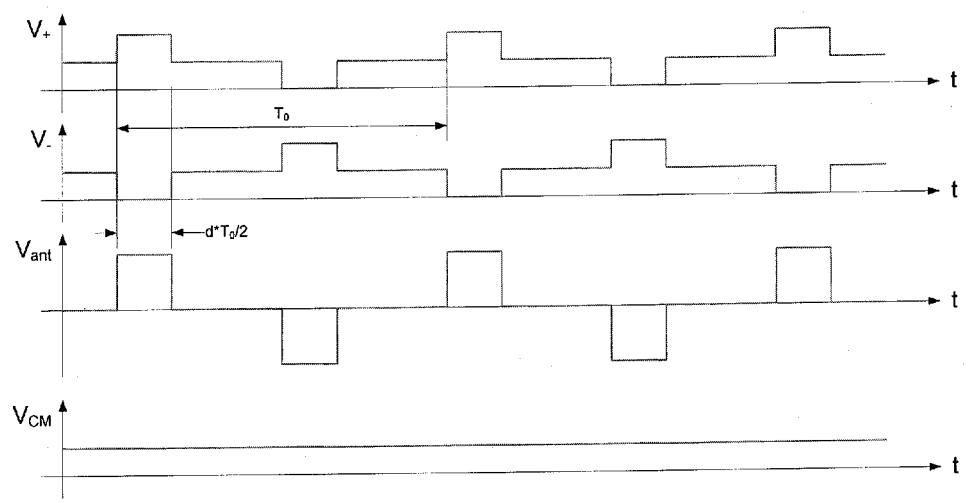
FIG. 6 shows an example timing diagram of a square wave driver in accordance with the instant disclosure.

The three-level square wave voltage signals provided to the embodiments described above can be seen in FIG. 6. As can be seen in FIG. 6, the driver pattern has four steps per drive period with an amplitude half of $V_{DD}$ (operating both driver outputs with three-levels). In this manner, output signals, whose average is exactly $V_{mid}$, are delivered; thus, there is no residual common mode EMI emission.

A short time interval can be included in implementation of a switching RFID driver circuit. This short time interval is characterized as "break-before-make." This break-before-make interval can be placed between a mode of driving a resonator circuit, and applying a short to the circuit (and vice versa). Not including a break-before-make time interval may result in excessive current drawn from a supply through a path which consists only of transistors. The excessive currents through the transistor path could destroy the circuit. During a break-before-make interval, the two paths are not conducting, therefore, the excessive currents can be avoided.

Not connecting the break-before-make gap could also result in current flowing through the antenna coil of the resonator circuit, generating a high voltage. The high voltage generated could build up until a protection means (if included) of the circuit is activated, or damage the driver transistors in case that there is no such protection present. Further, the high voltage can cause the resonator circuit to lose a significant portion of the energy stored in the circuit, thereby causing the antenna current to become distorted.

Figure 7:
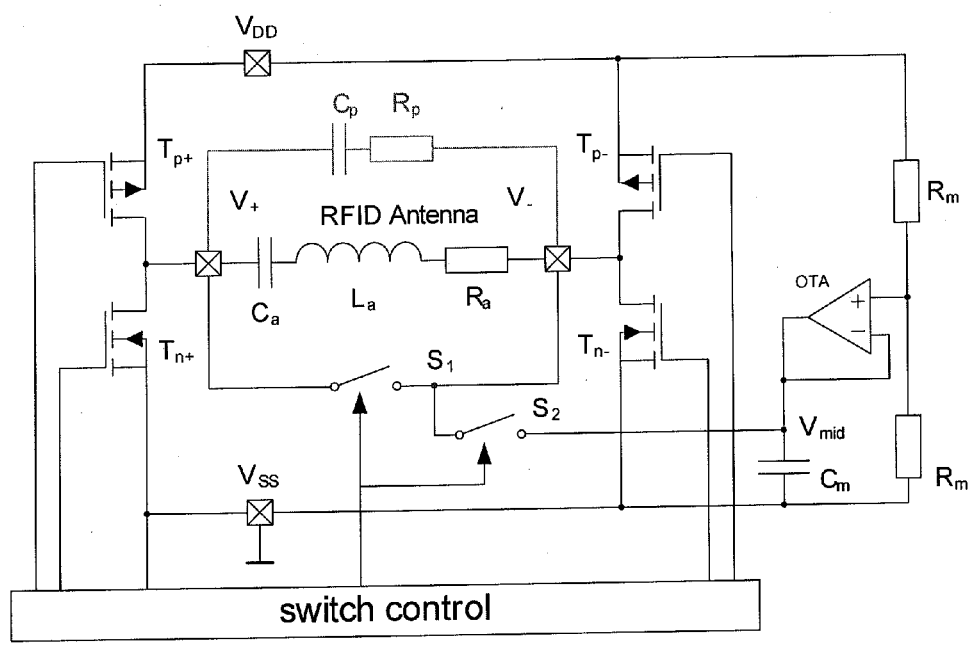
FIG. 7 shows a circuit, in accordance with the instant disclosure, including an illustrative break-before-make protection.

According to another specific aspect of the instant disclosure, a small capacitor $C_p$ is added (with an optional resistor ($R_p$) connected in series) in parallel to the resonator circuit between power receiving terminals (shown, for example, in FIG. 7). During the small break-before-make gap the capacitor ($C_p$) conducts the antenna current and thereby avoids the excessive voltage generated by the antenna coil. The series resistor ($R_p$), if present, limits the current which charges the parallel capacitor ($C_p$) when the driver is activated again.

Based upon the above discussion and illustrations, those skilled in the art will readily recognize that various modifications and changes may be made without strictly following the exemplary embodiments and applications illustrated and described herein. Furthermore, various features of the different embodiments may be implemented in various combinations. Such modifications do not depart from the true spirit and scope of the present disclosure, including those set forth in the following claims.

What is claimed is:

1. A transmission circuit comprising:
   a resonance circuit, located between power-receiving terminals, wirelessly transmitting an information signal to an external circuit;
   a capacitor and a resistor connected together in series between the power-receiving terminals; and
   switching circuitry configured and arranged for:
      generating different levels of square wave voltage signals by controlling coupling of the resonance circuit to power supply terminals, the different levels of square wave voltage signals including upper-level voltage signals, lower-level voltage signals, and mid-level voltage signals, to provide energy to the resonance circuit and, in turn, causing wireless transmission of the information signal; and when generating the mid-level voltage signals:
         eliminating DC current paths between power-receiving terminals and the power supply terminals,
         shorting the power-receiving terminals together thereby directing movement of charge stored in the resonance circuit from one of the power receiving terminals to the other power receiving terminal to generate the mid-level voltage signal, and
         pausing during switching to create a break-before-make gap, wherein the capacitor and resistor are in a current path which is connected in parallel with the resonance circuit and which conducts current during the break-before-make gap.

2. The transmission circuit of claim 1, wherein the switching circuitry further includes a feedback loop circuit configured and arranged to stabilize a mid-point potential of the circuit.

3. The transmission circuit of claim 1, wherein the switching circuitry includes at least one switch.

4. The transmission circuit of claim 1, wherein the resonance circuit has an operating frequency between 50 KHz and 150 KHz.

5. The transmission circuit of claim 1, wherein the DC current paths are eliminated prior to shorting the power-receiving terminals together.

6. The transmission circuit of claim 1, further including a proportional-integral-derivative controller (PID controller) circuit configured and arranged to control the switching circuitry.

7. The transmission circuit of claim 1, further including a mixed-signals control circuit configured and arranged to control the switching circuitry.

8. The transmission circuit of claim 1, wherein the shorting the power-receiving terminals together discharges an inductor of the resonance circuit.

9. The transmission circuit of claim 8, wherein in generating the different levels of square wave voltage signals by the switching circuit provides a DC current path from one of the power supply terminals to the inductor of the resonance circuit.

10. A system comprising:
    a transmission circuit, configured and arranged for transmitting an information signal, the transmission circuit including:
       a transmission resonance circuit including a capacitor and a resistor located between power-receiving terminals, configured and arranged to wirelessly transmit the information signal,
       switching circuitry configured and arranged for:
          generating three different levels of square wave voltage signals by controlling coupling of the power-receiving terminals to power supply terminals, the three different levels of square wave voltage signals including upper-level, lower-level, and mid-level voltage signals, to provide energy to the transmission resonance circuit and, in turn, causing wireless transmission of the information signal, and when generating the mid-level voltage signals:
             eliminating DC current paths from each of the power-receiving terminals to the power supply terminals, and
             shorting the power-receiving terminals together and thereby directing movement of charge stored in the resonance circuit from one of the power receiving terminals to the other power receiving terminal to generate the mid-level voltage signals; and pausing during switching to create a break-before-make gap, wherein the capacitor and resistor are in a current path which is connected in parallel with the resonance circuit and which conducts current during the break-before-make gap a receiver circuit, configured and arranged to receive the information signal, the receiver circuit including:

a receiver resonance circuit configured and arranged to wirelessly receive the information signal, and an identification circuit configured and arranged to confirm an authenticity of the transmission circuit.

11. The system of claim 10, wherein the transmission circuit and the receiver resonance circuit are incorporated into an audio amplifier.

12. The system of claim 10, wherein the transmission circuit and the receiver resonance circuit are incorporated into a passive-keyless entry device.

13. The system of claim 11, wherein the transmission circuit and the receiver resonance circuit are incorporated into a contactless charging system.

14. The system of claim 10, wherein the receiver resonator circuitry has an operating frequency between 50 and 150 KHz.

15. The system of claim 10, wherein common mode attenuations of 40 dB or greater are achieved.

* * * * *